United States Patent
Gruner et al.

(10) Patent No.: US 8,321,761 B1
(45) Date of Patent: Nov. 27, 2012

(54) ECC BITS USED AS ADDITIONAL REGISTER FILE STORAGE

(75) Inventors: Fred Gruner, Brea, CA (US); Xiaogang Qiu, San Jose, CA (US); Yan Yan Tang, San Jose, CA (US)

(73) Assignee: NVIDIA Corporation, Santa Clara, CA (US)

( * ) Notice: Subject to any disclaimer, the term of this patent is extended or adjusted under 35 U.S.C. 154(b) by 532 days.

(21) Appl. No.: 12/568,552

(22) Filed: Sep. 28, 2009

(51) Int. Cl.
*G11C 29/00* (2006.01)

(52) U.S. Cl. .......................... 714/764; 714/769

(58) Field of Classification Search .............. 714/6, 769, 714/766, 764, 763, 718
See application file for complete search history.

(56) References Cited

U.S. PATENT DOCUMENTS

| | | | |
|---|---|---|---|
| 6,378,103 B1 * | 4/2002 | Han ............................... | 714/769 |
| 6,598,199 B2 * | 7/2003 | Tetrick ........................... | 714/766 |
| 7,290,185 B2 * | 10/2007 | Kirscht ........................... | 714/704 |
| 7,689,804 B2 | 3/2010 | Vera et al. | |
| 7,904,786 B2 * | 3/2011 | Hilton et al. .................... | 714/758 |
| 2009/0055682 A1 * | 2/2009 | Gibson et al. ..................... | 714/6 |
| 2009/0055713 A1 * | 2/2009 | Hong et al. ...................... | 714/763 |
| 2010/0088572 A1 | 4/2010 | Ohnuki et al. | |
| 2011/0035643 A1 | 2/2011 | Bybell et al. | |

FOREIGN PATENT DOCUMENTS

| | | |
|---|---|---|
| WO | 2008127610 | 10/2008 |
| WO | 2008127622 | 10/2008 |
| WO | 2008127623 | 10/2008 |

OTHER PUBLICATIONS

Notice of Allowance fro U.S. Appl. No. 12/568,557, dated Apr. 13, 2012.

* cited by examiner

*Primary Examiner* — David Ton
(74) *Attorney, Agent, or Firm* — Patterson & Sherian, LLP

(57) ABSTRACT

A memory module includes a plurality of register files. Each register file is associated with a set of error-correcting code (ECC) bits and ECC check/correct logic that can provide error-correcting functionality, if required. When error-correcting functionality is not required, ECC bits are grouped together to form additional register files, thereby providing additional storage space.

19 Claims, 8 Drawing Sheets

ECC BITS USED AS ADDITIONAL REGISTER FILE STORAGE

BACKGROUND OF THE INVENTION

1. Field of the Invention

The present invention generally relates to computer hardware and more specifically to using error-correcting code bits as additional register file storage.

2. Description of the Related Art

A conventional memory unit may include billions of bits of data, each of which is stored by a set of transistors within the memory unit. Certain environmental conditions can affect the transistors that store a particular bit, causing the bit to be "flipped" (i.e., changed from a "1" to a "0" or from a "0" to a "1"). For example, a neutron or an alpha particle could impact a transistor in the set of transistors, causing those transistors to store a "1" instead of a "0," or vice versa.

Some data, such as financial data or medical data, is highly sensitive to bit flips and must be discarded even when just one bit is flipped. To ensure that none of the bits included in the memory unit have been flipped, the memory unit may also include "error-correcting code" (ECC) bits. ECC bits can be used to identify bits that have been flipped.

Some processing units may include internal memory units that implement ECC bits to ensure the integrity of stored data. These processing units may be provided to customers who require a high degree of data integrity (i.e., zero flipped bits) as a value-added feature. However, processing units that implement ECC bits may also be supplied to customers that do not require a high degree of data integrity. In this situation, the ECC bits are extraneous, and, thus, waste valuable processing unit area without providing any benefit.

SUMMARY OF THE INVENTION

One embodiment of the invention includes a processing unit that includes a set of first memory modules each having two or more enable lines that each are located at M-bit boundaries, a set of second memory modules each having one or more enable lines that each are located at N-bit boundaries, where N is greater than M, and a memory controller configured to enable the two or more enable lines simultaneously to access N bits from a memory module in the set of first memory modules.

Another embodiment of the invention includes memory controller configured to access a first value having a first size and a second value having the first size, where the first value is stored in a first memory module and the memory controller accesses the first value by transmitting a single enable to the first memory module, and where the second value is stored in the second memory module and the memory controller accesses the second value by transmitting at least two enables to the second memory module.

Advantageously, in situations where separate memory modules are not required within a processing unit, two or more such memory modules can be grouped together to provide additional storage space.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the invention. However, it will be apparent to one of skill in the art that the invention may be practiced without one or more of these specific details. In other instances, well-known features have not been described in order to avoid obscuring the invention.

System Overview

Figure 1:
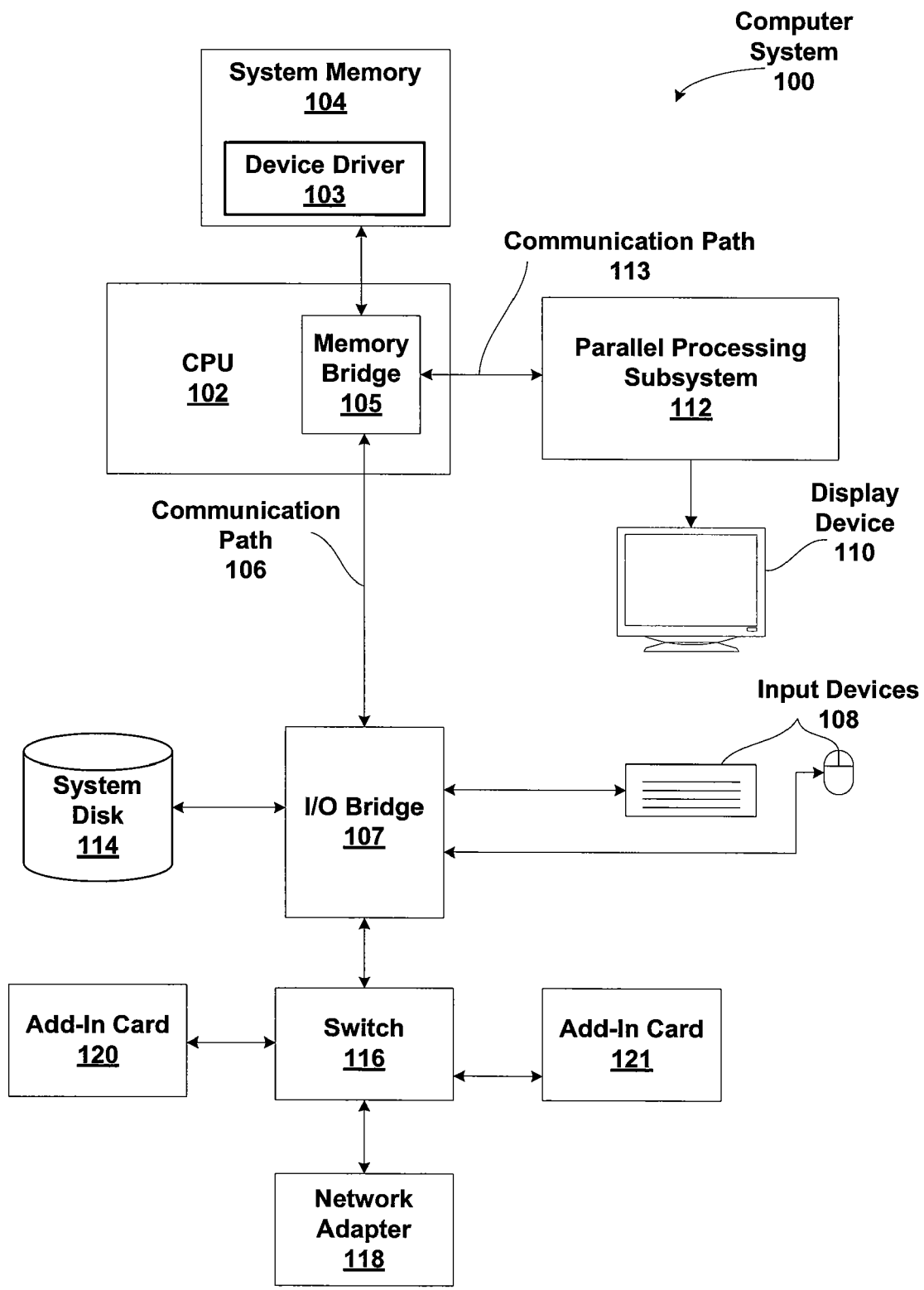
FIG. 1 is a block diagram that illustrates a computer system configured to implement one or more aspects of the invention.

FIG. 1 is a block diagram illustrating a computer system 100 configured to implement one or more aspects of the invention. Computer system 100 includes a central processing unit (CPU) 102 and a system memory 104 communicating via a bus path through a memory bridge 105. Memory bridge 105 may be integrated into CPU 102 as shown in FIG. 1. Alternatively, memory bridge 105, may be a conventional device, e.g., a Northbridge chip, that is connected via a bus to CPU 102. Memory bridge 105 is connected via communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse) and forwards the input to CPU 102 via path 106 and memory bridge 105. A parallel processing subsystem 112 is coupled to memory bridge 105 via a bus or other communication path 113 (e.g., a PCI Express, Accelerated Graphics Port, or HyperTransport link); in one embodiment parallel processing subsystem 112 is a graphics subsystem that delivers pixels to a display device 110 (e.g., a conventional CRT or LCD based monitor). A system disk 114 is also connected to I/O bridge 107. A switch 116 provides connections between I/O bridge 107 and other components such as a network adapter 118 and various add-in cards 120 and 121. Other components (not explicitly shown), including USB or other port connections, CD drives, DVD drives, film recording devices, and the like, may also be connected to I/O bridge 107. Communication paths interconnecting the various components in FIG. 1 may be implemented using any suitable protocols, such as PCI (Peripheral Component Interconnect), PCI-Express (PCI-E), AGP (Accelerated Graphics Port), HyperTransport, or any other bus or point-to-point communication protocol(s), and connections between different devices may use different protocols as is known in the art.

In one embodiment, the parallel processing subsystem 112 incorporates circuitry optimized for graphics and video processing, including, for example, video output circuitry, and constitutes a graphics processing unit (GPU). In another embodiment, the parallel processing subsystem 112 incorporates circuitry optimized for general purpose processing, while preserving the underlying computational architecture, described in greater detail herein. In yet another embodiment, the parallel processing subsystem 112 may be integrated with one or more other system elements, such as the memory bridge 105, CPU 102, and I/O bridge 107 to form a system on chip (SoC).

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies, parallel processing subsystem 112 is connected to I/O bridge 107 or directly to CPU 102, rather than to memory bridge 105. In still other embodiments, one or more of CPU 102, I/O bridge 107, parallel processing subsystem 112, and memory bridge 105 may be integrated into one or more chips. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Figure 2:
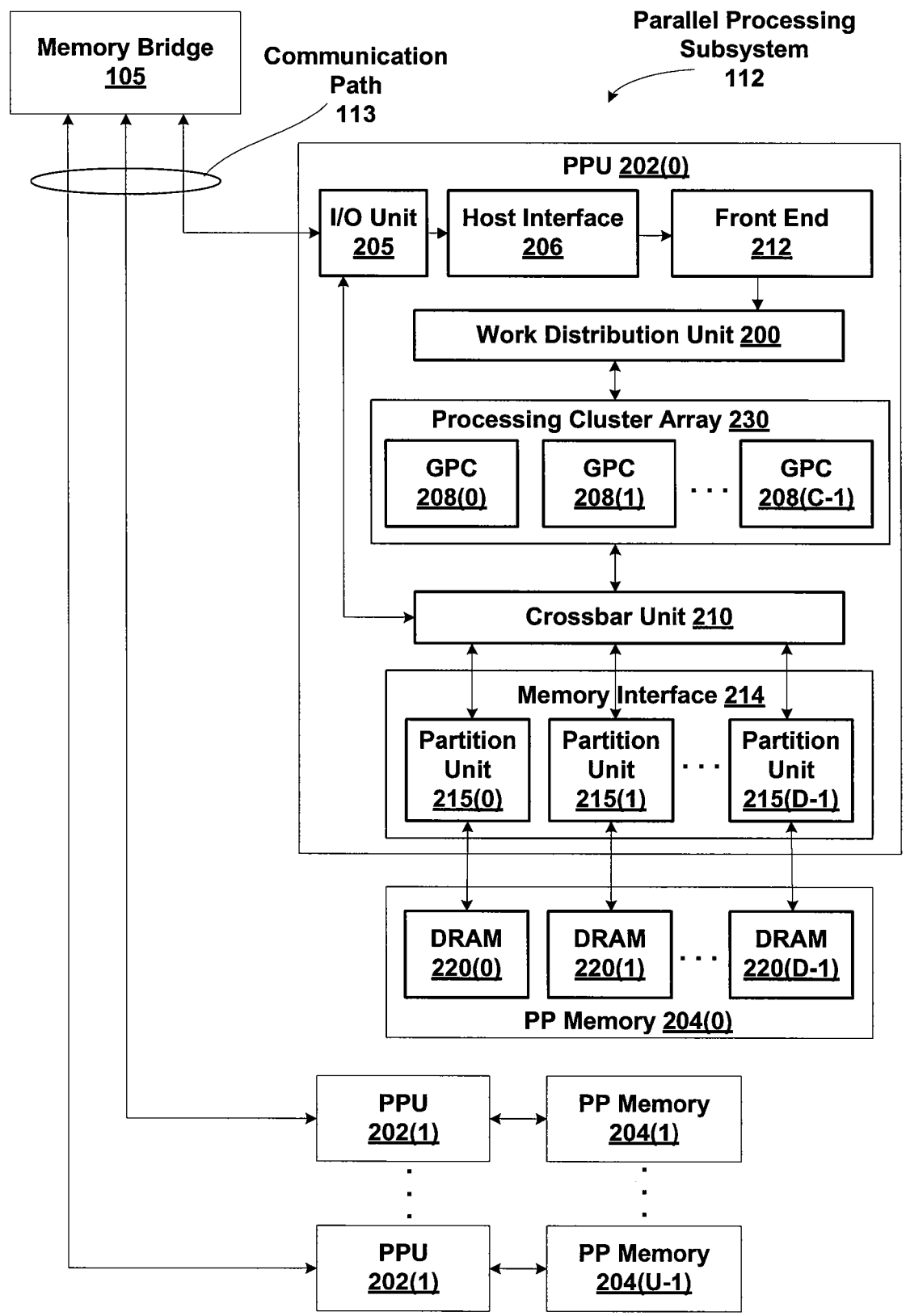
FIG. 2 is a block diagram of a parallel processing subsystem for the computer system of FIG. 1, according to one embodiment of the invention.

FIG. 2 illustrates a parallel processing subsystem 112, according to one embodiment of the invention. As shown, parallel processing subsystem 112 includes one or more parallel processing units (PPUs) 202, each of which is coupled to a local parallel processing (PP) memory 204. In general, a parallel processing subsystem includes a number U of PPUs, where $U \geq 1$. (Herein, multiple instances of like objects are denoted with reference numbers identifying the object and parenthetical numbers identifying the instance where needed.) PPUs 202 and parallel processing memories 204 may be implemented using one or more integrated circuit devices, such as programmable processors, application specific integrated circuits (ASICs), or memory devices, or in any other technically feasible fashion.

Referring again to FIG. 1, in some embodiments, some or all of PPUs 202 in parallel processing subsystem 112 are graphics processors with rendering pipelines that can be configured to perform various tasks related to generating pixel data from graphics data supplied by CPU 102 and/or system memory 104, interacting with local parallel processing memory 204 (which can be used as graphics memory including, e.g., a conventional frame buffer) to store and update pixel data, delivering pixel data to display device 110, and the like. In some embodiments, parallel processing subsystem 112 may include one or more PPUs 202 that operate as graphics processors and one or more other PPUs 202 that are used for general-purpose computations. The PPUs may be identical or different, and each PPU may have its own dedicated parallel processing memory device(s) or no dedicated parallel processing memory device(s). One or more PPUs 202 may output data to display device 110 or each PPU 202 may output data to one or more display devices 110.

In operation, CPU 102 is the master processor of computer system 100, controlling and coordinating operations of other system components. In particular, CPU 102 issues commands that control the operation of PPUs 202. In some embodiments, CPU 102 writes a stream of commands for each PPU 202 to a command buffer (not explicitly shown in either FIG. 1 or FIG. 2) that may be located in system memory 104, parallel processing memory 204, or another storage location accessible to both CPU 102 and PPU 202. PPU 202 reads the command stream from the command buffer and then executes commands asynchronously relative to the operation of CPU 102. CPU 102 may also create data buffers that PPUs 202 may read in response to commands in the command buffer. Each command and data buffer may be read by each of PPUs 202.

Referring back now to FIG. 2, each PPU 202 includes an I/O (input/output) unit 205 that communicates with the rest of computer system 100 via communication path 113, which connects to memory bridge 105 (or, in one alternative embodiment, directly to CPU 102). The connection of PPU 202 to the rest of computer system 100 may also be varied. In some embodiments, parallel processing subsystem 112 is implemented as an add-in card that can be inserted into an expansion slot of computer system 100. In other embodiments, a PPU 202 can be integrated on a single chip with a bus bridge, such as memory bridge 105 or I/O bridge 107. In still other embodiments, some or all elements of PPU 202 may be integrated on a single chip with CPU 102.

In one embodiment, communication path 113 is a PCI-Express link, in which dedicated lanes are allocated to each PPU 202, as is known in the art. Other communication paths may also be used. An I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to parallel processing memory 204) may be directed to a memory crossbar unit 210. Host interface 206 reads each command buffer and outputs the work specified by the command buffer to a front end 212.

Each PPU 202 advantageously implements a highly parallel processing architecture. As shown in detail, PPU 202(0) includes a processing cluster array 230 that includes a number C of general processing clusters (GPCs) 208, where $C \geq 1$. Each GPC 208 is capable of executing a large number (e.g., hundreds or thousands) of threads concurrently, where each thread is an instance of a program. In various applications, different GPCs 208 may be allocated for processing different types of programs or for performing different types of computations. For example, in a graphics application, a first set of GPCs 208 may be allocated to perform tessellation operations and to produce primitive topologies for patches, and a second set of GPCs 208 may be allocated to perform tessellation shading to evaluate patch parameters for the primitive topologies and to determine vertex positions and other per-vertex attributes. The allocation of GPCs 208 may vary depending on the workload arising for each type of program or computation. Alternatively, GPCs 208 may be allocated to perform processing tasks using a time-slice scheme to switch between different processing tasks.

GPCs 208 receive processing tasks to be executed via a work distribution unit 200, which receives commands defining processing tasks from front end unit 212. Processing tasks include pointers to data to be processed, e.g., surface (patch)

data, primitive data, vertex data, and/or pixel data, as well as state parameters and commands defining how the data is to be processed (e.g., what program is to be executed). Work distribution unit 200 may be configured to fetch the pointers corresponding to the processing tasks, may receive the pointers from front end 212, or may receive the data directly from front end 212. In some embodiments, indices specify the location of the data in an array. Front end 212 ensures that GPCs 208 are configured to a valid state before the processing specified by the command buffers is initiated.

When PPU 202 is used for graphics processing, for example, the processing workload for each patch is divided into approximately equal sized tasks to enable distribution of the tessellation processing to multiple GPCs 208. A work distribution unit 200 may be configured to output tasks at a frequency capable of providing tasks to multiple GPCs 208 for processing. In some embodiments of the present invention, portions of GPCs 208 are configured to perform different types of processing. For example a first portion may be configured to perform vertex shading and topology generation, a second portion may be configured to perform tessellation and geometry shading, and a third portion may be configured to perform pixel shading in screen space to produce a rendered image. The ability to allocate portions of GPCs 208 for performing different types of processing tasks efficiently accommodates any expansion and contraction of data produced by those different types of processing tasks. Intermediate data produced by GPCs 208 may be buffered to allow the intermediate data to be transmitted between GPCs 208 with minimal stalling in cases where the rate at which data is accepted by a downstream GPC 208 lags the rate at which data is produced by an upstream GPC 208.

Memory interface 214 may be partitioned into a number D of memory partition units that are each coupled to a portion of parallel processing memory 204, where D≧1. Each portion of parallel processing memory 204 generally includes one or more memory devices (e.g DRAM 220). Persons skilled in the art will appreciate that DRAM 220 may be replaced with other suitable storage devices and can be of generally conventional design. A detailed description is therefore omitted. Render targets, such as frame buffers or texture maps may be stored across DRAMs 220, allowing partition units 215 to write portions of each render target in parallel to efficiently use the available bandwidth of parallel processing memory 204.

Any one of GPCs 208 may process data to be written to any of the DRAMs 220 within parallel processing memory 204. Crossbar unit 210 is configured to route the output of each GPC 208 to the input of any partition unit 215 or to another GPC 208 for further processing. GPCs 208 communicate with memory interface 214 through crossbar unit 210 to read from or write to various external memory devices. In one embodiment, crossbar unit 210 has a connection to memory interface 214 to communicate with I/O unit 205, as well as a connection to local parallel processing memory 204, thereby enabling the processing cores within the different GPCs 208 to communicate with system memory 104 or other memory that is not local to PPU 202. Crossbar unit 210 may use virtual channels to separate traffic streams between the GPCs 208 and partition units 215.

Again, GPCs 208 can be programmed to execute processing tasks relating to a wide variety of applications, including but not limited to, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel shader programs), and so on. PPUs 202 may transfer data from system memory 104 and/or local parallel processing memories 204 into internal (on-chip) memory, process the data, and write result data back to system memory 104 and/or local parallel processing memories 204, where such data can be accessed by other system components, including CPU 102 or another parallel processing subsystem 112.

A PPU 202 may be provided with any amount of local parallel processing memory 204, including no local memory, and may use local memory and system memory in any combination. For instance, a PPU 202 can be a graphics processor in a unified memory architecture (UMA) embodiment. In such embodiments, little or no dedicated graphics (parallel processing) memory would be provided, and PPU 202 would use system memory exclusively or almost exclusively. In UMA embodiments, a PPU 202 may be integrated into a bridge chip or processor chip or provided as a discrete chip with a high-speed link (e.g., PCI-Express) connecting the PPU 202 to system memory via a bridge chip or other communication means.

As noted above, any number of PPUs 202 can be included in a parallel processing subsystem 112. For instance, multiple PPUs 202 can be provided on a single add-in card, or multiple add-in cards can be connected to communication path 113, or one or more PPUs 202 can be integrated into a bridge chip. PPUs 202 in a multi-PPU system may be identical to or different from one another. For instance, different PPUs 202 might have different numbers of processing cores, different amounts of local parallel processing memory, and so on. Where multiple PPUs 202 are present, those PPUs may be operated in parallel to process data at a higher throughput than is possible with a single PPU 202. Systems incorporating one or more PPUs 202 may be implemented in a variety of configurations and form factors, including desktop, laptop, or handheld personal computers, servers, workstations, game consoles, embedded systems, and the like.

Processing Cluster Array Overview

Figure 3A:
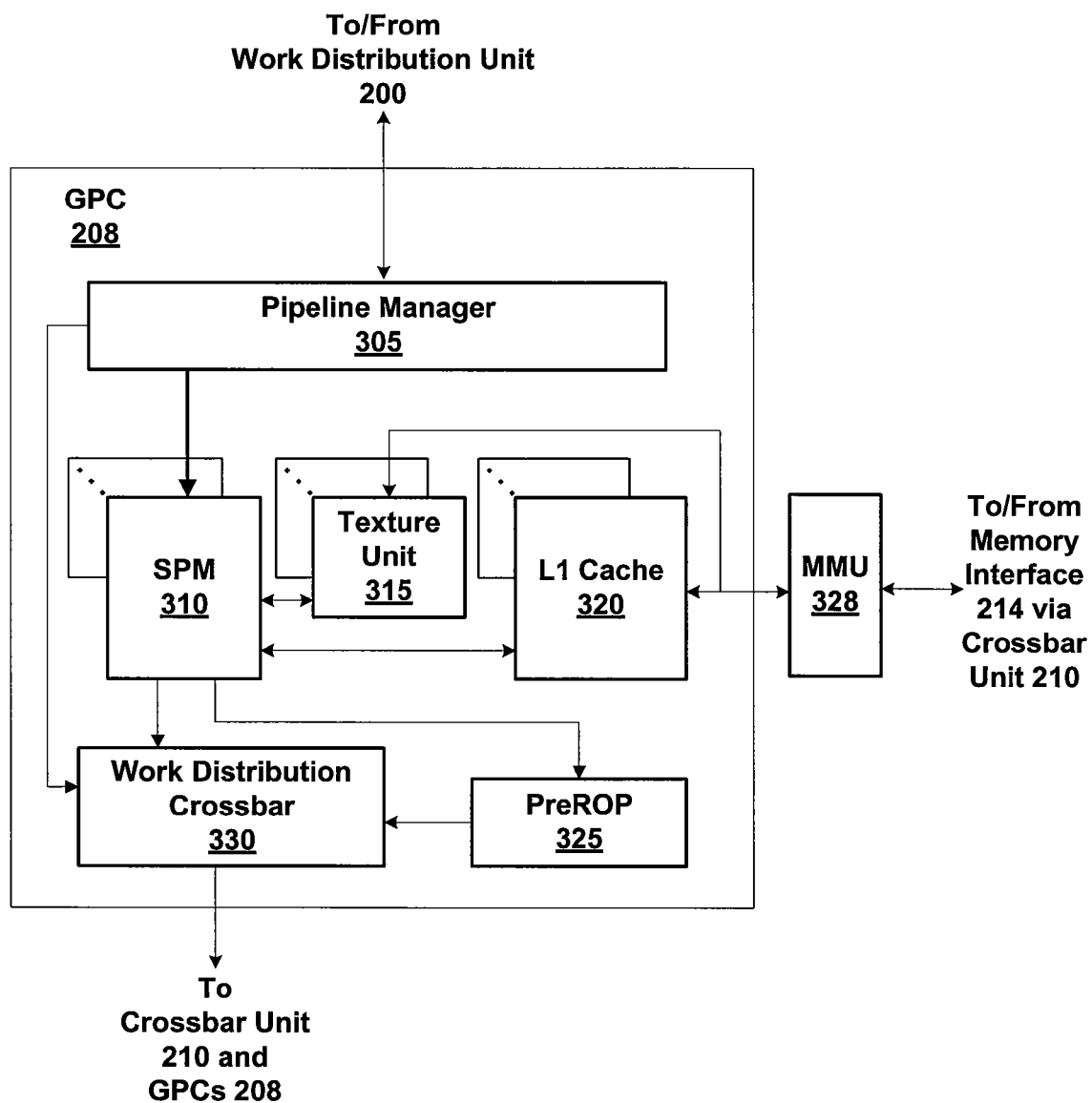
FIG. 3A is a block diagram of a GPC within one of the PPUs of FIG. 2, according to one embodiment of the invention.

FIG. 3A is a block diagram of a GPC 208 within one of the PPUs 202 of FIG. 2, according to one embodiment of the invention. Each GPC 208 may be configured to execute a large number of threads in parallel, where the term "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within each one of the GPCs 208. Unlike a SIMD execution regime, where all processing engines typically execute identical instructions, SIMT execution allows different threads to more readily follow divergent execution paths through a given thread program. Persons skilled in the art will understand that a SIMD processing regime represents a functional subset of a SIMT processing regime.

In graphics applications, a GPC 208 may be configured to implement a primitive engine for performing screen space graphics processing functions that may include, but are not limited to primitive setup, rasterization, and z culling. The primitive engine receives a processing task from work distribution unit 200, and when the processing task does not require the operations performed by primitive engine, the processing task is passed through the primitive engine to a pipeline manager 305. Operation of GPC 208 is advantageously controlled via a pipeline manager 305 that distributes processing tasks to streaming multiprocessors (SPMs) 310. Pipeline manager 305 may also be configured to control a work distribution crossbar 330 by specifying destinations for processed data output by SPMs 310.

In one embodiment, each GPC 208 includes a number M of SPMs 310, where M≧1, each SPM 310 configured to process one or more thread groups. The series of instructions transmitted to a particular GPC 208 constitutes a thread, as previously defined herein, and the collection of a certain number of concurrently executing threads across the parallel processing engines (not shown) within an SPM 310 is referred to herein as a "thread group." As used herein, a "thread group" refers to a group of threads concurrently executing the same program on different input data, with each thread of the group being assigned to a different processing engine within an SPM 310. A thread group may include fewer threads than the number of processing engines within the SPM 310, in which case some processing engines will be idle during cycles when that thread group is being processed. A thread group may also include more threads than the number of processing engines within the SPM 310, in which case processing will take place over multiple clock cycles. Since each SPM 310 can support up to G thread groups concurrently, it follows that up to G×M thread groups can be executing in GPC 208 at any given time.

Additionally, a plurality of related thread groups may be active (in different phases of execution) at the same time within an SPM 310. This collection of thread groups is referred to herein as a "cooperative thread array" ("CTA"). The size of a particular CTA is equal to m*k, where k is the number of concurrently executing threads in a thread group and is typically an integer multiple of the number of parallel processing engines within the SPM 310, and m is the number of thread groups simultaneously active within the SPM 310. The size of a CTA is generally determined by the programmer and the amount of hardware resources, such as memory or registers, available to the CTA.

An exclusive local address space is available to each thread, and a shared per-CTA address space is used to pass data between threads within a CTA. Data stored in the per-thread local address space and per-CTA address space is stored in L1 cache 320, and an eviction policy may be used to favor keeping the data in L1 cache 320. Each SPM 310 uses space in a corresponding L1 cache 320 that is used to perform load and store operations. Each SPM 310 also has access to L2 caches within the partition units 215 that are shared among all GPCs 208 and may be used to transfer data between threads. Finally, SPMs 310 also have access to off-chip "global" memory, which can include, e.g., parallel processing memory 204 and/or system memory 104. An L2 cache may be used to store data that is written to and read from global memory. It is to be understood that any memory external to PPU 202 may be used as global memory.

Also, each SPM 310 advantageously includes an identical set of functional units (e.g., arithmetic logic units, etc.) that may be pipelined, allowing a new instruction to be issued before a previous instruction has finished, as is known in the art. Any combination of functional units may be provided. In one embodiment, the functional units support a variety of operations including integer and floating point arithmetic (e.g., addition and multiplication), comparison operations, Boolean operations (AND, OR, XOR), bit-shifting, and computation of various algebraic functions (e.g., planar interpolation, trigonometric, exponential, and logarithmic functions, etc.); and the same functional-unit hardware can be leveraged to perform different operations.

Each GPC 208 may include a memory management unit (MMU) 328 that is configured to map virtual addresses into physical addresses. In other embodiments, MMU(s) 328 may reside within the memory interface 214. The MMU 328 includes a set of page table entries (PTEs) used to map a virtual address to a physical address of a tile and optionally a cache line index. The physical address is processed to distribute surface data access locality to allow efficient request interleaving among partition units. The cache line index may be used to determine whether of not a request for a cache line is a hit or miss.

In graphics applications, a GPC 208 may be configured such that each SPM 310 is coupled to a texture unit 315 for performing texture mapping operations, e.g., determining texture sample positions, reading texture data, and filtering the texture data. Texture data is read via memory interface 214 and is fetched from an L2 cache, parallel processing memory 204, or system memory 104, as needed. Texture unit 315 may be configured to store the texture data in an internal cache. In some embodiments, texture unit 315 is coupled to L1 cache 320, and texture data is stored in L1 cache 320. Each SPM 310 outputs processed tasks to work distribution crossbar 330 in order to provide the processed task to another GPC 208 for further processing or to store the processed task in an L2 cache, parallel processing memory 204, or system memory 104 via crossbar unit 210. A preROP (pre-raster operations) 325 is configured to receive data from SPM 310, direct data to ROP units within partition units 215, and perform optimizations for color blending, organize pixel color data, and perform address translations.

It will be appreciated that the core architecture described herein is illustrative and that variations and modifications are possible. Any number of processing engines, e.g., primitive engines, SPMs 310, texture units 315, or preROPs 325 may be included within a GPC 208. Further, while only one GPC 208 is shown, a PPU 202 may include any number of GPCs 208 that are advantageously functionally similar to one another so that execution behavior does not depend on which GPC 208 receives a particular processing task. Further, each GPC 208 advantageously operates independently of other GPCs 208 using separate and distinct processing engines, L1 caches 320, and so on.

Figure 3B:
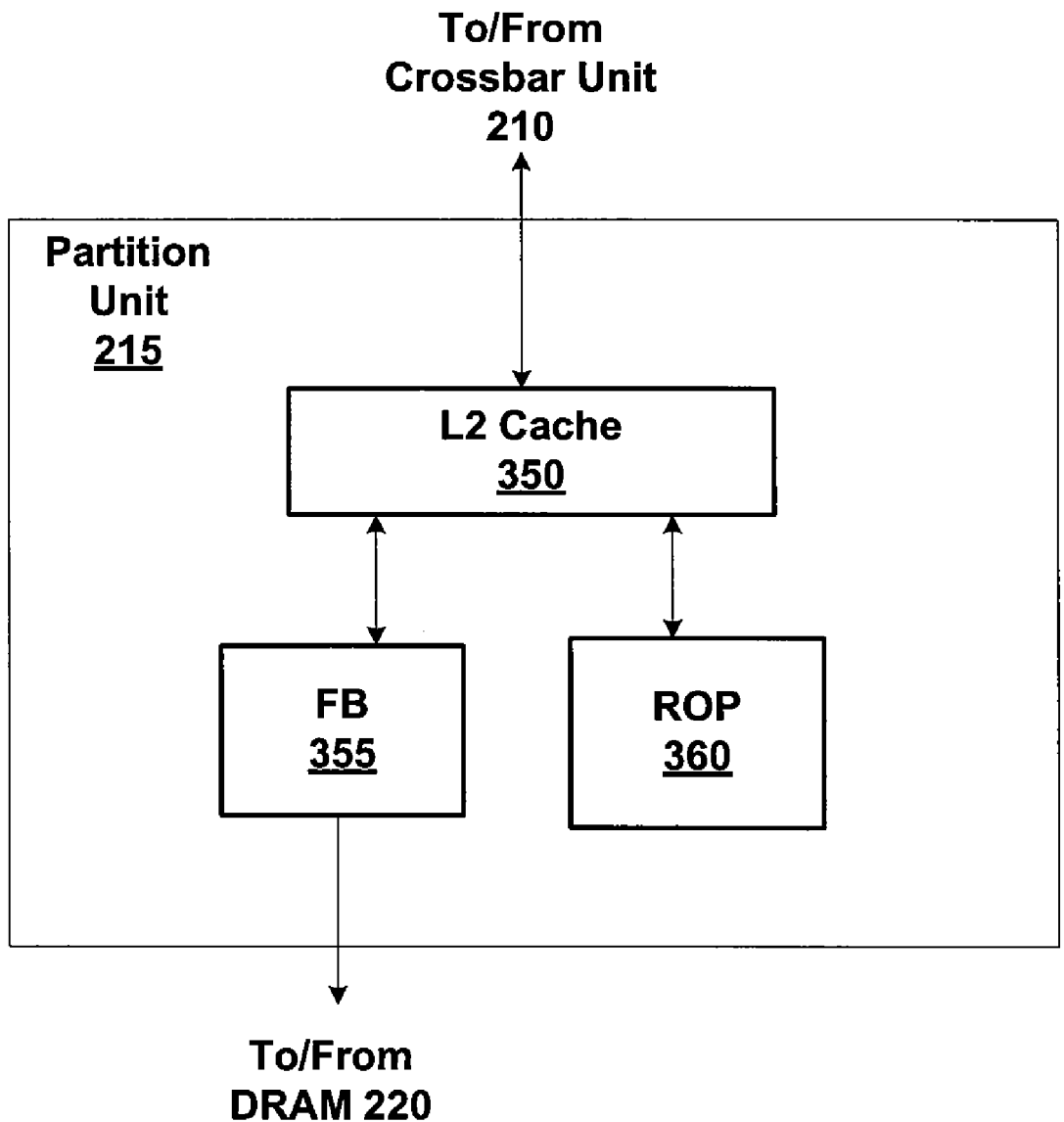
FIG. 3B is a block diagram of a partition unit within one of the PPUs of FIG. 2, according to one embodiment of the invention.

FIG. 3B is a block diagram of a partition unit 215 within one of the PPUs 202 of FIG. 2, according to one embodiment of the invention. As shown, partition unit 215 includes a L2 cache 350, a frame buffer (FB) 355, and a raster operations unit (ROP) 360. L2 cache 350 is a read/write cache that is configured to perform load and store operations received from crossbar unit 210 and ROP 360. Read misses and urgent writeback requests are output by L2 cache 350 to FB 355 for processing. Dirty updates are also sent to FB 355 for opportunistic processing. FB 355 interfaces directly with DRAM 220, outputting read and write requests and receiving data read from DRAM 220.

In graphics applications, ROP 360 is a processing unit that performs raster operations, such as stencil, z test, blending, and the like, and outputs pixel data as processed graphics data for storage in graphics memory. In some embodiments of the present invention, ROP 360 is included within each GPC 208 instead of partition unit 215, and pixel read and write requests are transmitted over crossbar unit 210 instead of pixel fragment data.

The processed graphics data may be displayed on display device 110 or routed for further processing by CPU 102 or by one of the processing entities within parallel processing subsystem 112. Each partition unit 215 includes a ROP 360 in order to distribute processing of the raster operations. In some embodiments, ROP 360 may be configured to compress z or color data that is written to memory and decompress z or color data that is read from memory.

Persons skilled in the art will understand that the architecture described in FIGS. 1, 2, 3A and 3B in no way limits the scope of the present invention and that the techniques taught herein may be implemented on any properly configured processing unit, including, without limitation, one or more CPUs, one or more multi-core CPUs, one or more PPUs 202, one or more GPCs 208, one or more graphics or special purpose processing units, or the like, without departing the scope of the present invention.

Graphics Pipeline Architecture

Figure 4:
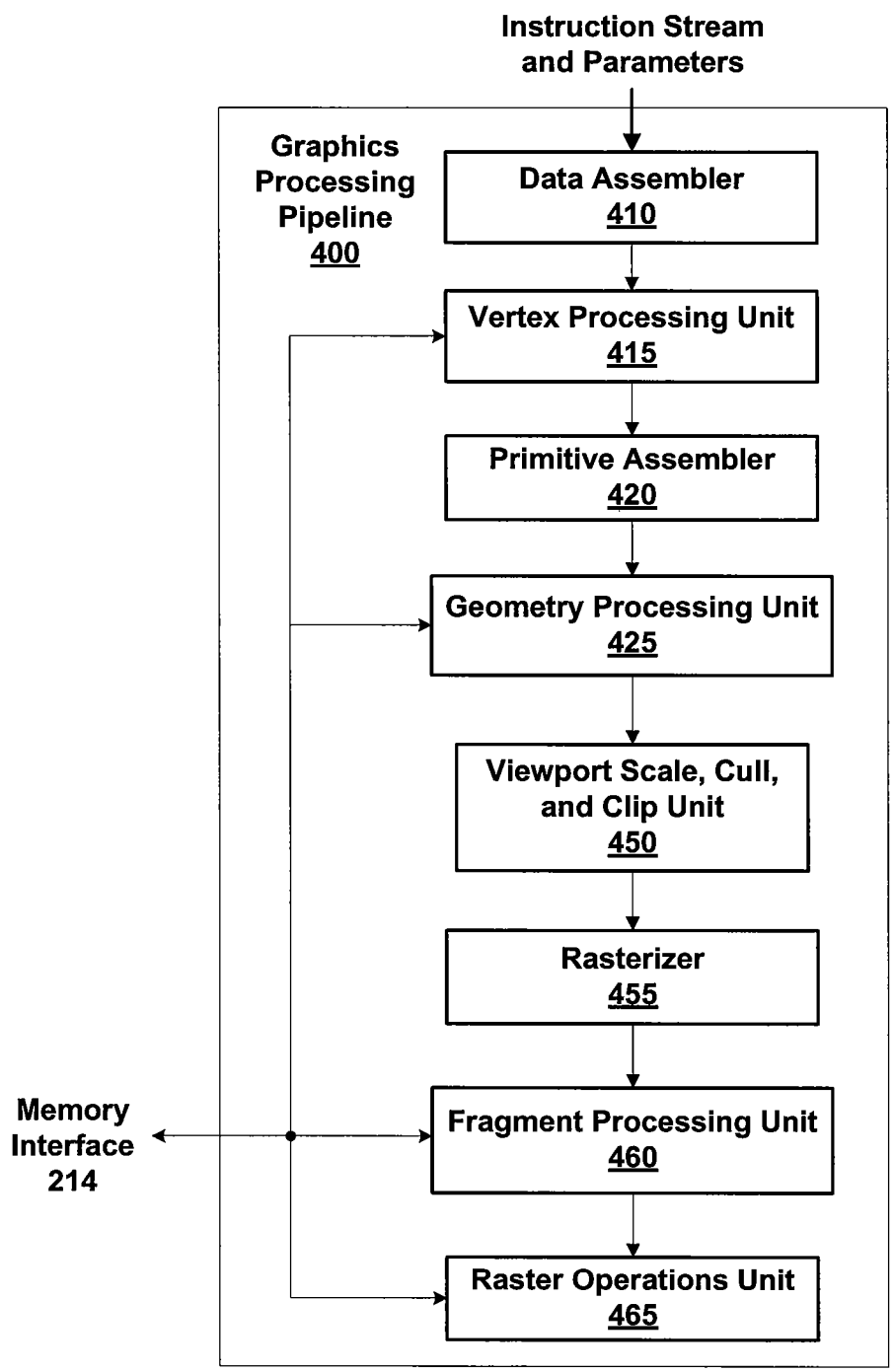
FIG. 4 is a conceptual diagram of a graphics processing pipeline that one or more of the PPUs of FIG. 2 can be configured to implement, according to one embodiment of the invention.

FIG. 4 is a conceptual diagram of a graphics processing pipeline 400, that one or more of the PPUs 202 of FIG. 2 can be configured to implement, according to one embodiment of the invention. For example, one of the SPMs 310 may be configured to perform the functions of one or more of a vertex processing unit 415, a geometry processing unit 425, and a fragment processing unit 460. The functions of data assembler 410, primitive assembler 420, rasterizer 455, and raster operations unit 465 may also be performed by other processing engines within a GPC 208 and a corresponding partition unit 215. Alternately, graphics processing pipeline 400 may be implemented using dedicated processing units for one or more functions. In one embodiment, each each unit within the graphics processing pipeline 400 is implemented by executing a specific shader program retrieved from system memory 104, PP memory 204, or another memory unit.

Data assembler 410 processing unit collects vertex data for high-order surfaces, primitives, and the like, and outputs the vertex data, including the vertex attributes, to vertex processing unit 415. Vertex processing unit 415 is a programmable execution unit that is configured to execute vertex shader programs, lighting and transforming vertex data as specified by the vertex shader programs. For example, vertex processing unit 415 may be programmed to transform the vertex data from an object-based coordinate representation (object space) to an alternatively based coordinate system such as world space or normalized device coordinates (NDC) space. Vertex processing unit 415 may read data that is stored in L1 cache 320, parallel processing memory 204, or system memory 104 by data assembler 410 for use in processing the vertex data.

Primitive assembler 420 receives vertex attributes from vertex processing unit 415, reading stored vertex attributes, as needed, and constructs graphics primitives for processing by geometry processing unit 425. Graphics primitives include triangles, line segments, points, and the like. Geometry processing unit 425 is a programmable execution unit that is configured to execute geometry shader programs, transforming graphics primitives received from primitive assembler 420 as specified by the geometry shader programs. For example, geometry processing unit 425 may be programmed to subdivide the graphics primitives into one or more new graphics primitives and calculate parameters, such as plane equation coefficients, that are used to rasterize the new graphics primitives.

In some embodiments, geometry processing unit 425 may also add or delete elements in the geometry stream. Geometry processing unit 425 outputs the parameters and vertices specifying new graphics primitives to a viewport scale, cull, and clip unit 450. Geometry processing unit 425 may read data that is stored in parallel processing memory 204 or system memory 104 for use in processing the geometry data. Viewport scale, cull, and clip unit 450 performs clipping, culling, and viewport scaling and outputs processed graphics primitives to a rasterizer 455.

Rasterizer 455 scan converts the new graphics primitives and outputs fragments and coverage data to fragment processing unit 460. Additionally, rasterizer 455 may be configured to perform z culling and other z-based optimizations.

Fragment processing unit 460 is a programmable execution unit that is configured to execute fragment shader programs, transforming fragments received from rasterizer 455, as specified by the fragment shader programs. For example, fragment processing unit 460 may be programmed to perform operations such as perspective correction, texture mapping, shading, blending, and the like, to produce shaded fragments that are output to raster operations unit 465. Fragment processing unit 460 may read data that is stored in parallel processing memory 204 or system memory 104 for use in processing the fragment data. Fragments may be shaded at pixel, sample, or other granularity, depending on the programmed sampling rate.

Raster operations unit 465 is a processing unit that performs raster operations, such as stencil, z test, blending, and the like, and outputs pixel data as processed graphics data for storage in graphics memory. The processed graphics data may be stored in graphics memory, e.g., parallel processing memory 204, and/or system memory 104, for display on display device 110 or for further processing by CPU 102 or parallel processing subsystem 112. In some embodiments of the present invention, raster operations unit 465 is configured to compress z or color data that is written to memory and decompress z or color data that is read from memory.

Error-Correcting Code Bits

Figure 5:
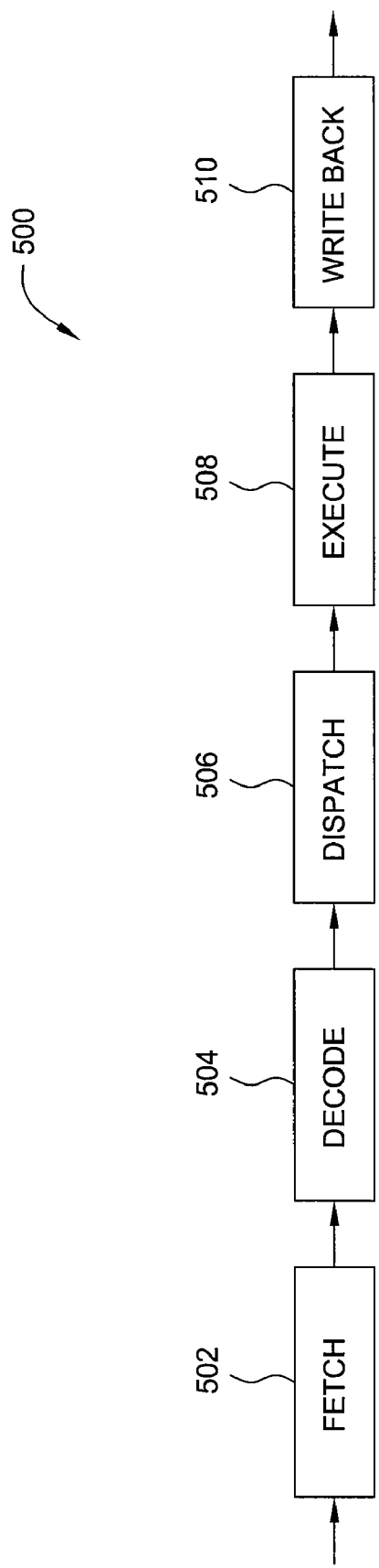
FIG. 5 is a block diagram of a hardware pipeline configured to process one or more threads, according to one embodiment of the invention.

FIG. 5 is a block diagram of a hardware (HW) pipeline 500 configured to process one or more threads, according to one embodiment of the invention. As shown, HW pipeline 500 includes fetch 502, decode 504, dispatch 506, execute 508, and write back 510. HW pipeline 500 is configured to process a group of threads, referred to herein as a "warp." Each thread within the warp may be processed by HW pipeline 500 using different input data or using the same input data. HW pipeline 500 executes different sets of program instructions in order to perform different processing operations associated with each thread within the warp.

In one embodiment, HW pipeline 500 performs graphics processing operations by executing one or more different shader programs. Each shader program may be executed to implement the functionality of a different processing unit within the graphics processing pipeline 400 described in FIG. 4. In another embodiment, HW pipeline 500 may perform general-purpose processing operations by executing one or more different general-purpose computing programs, such as, for example, a compute unified device architecture (CUDA) program.

When HW pipeline 500 executes a program, such as a graphics processing program or a general-purpose computing program, fetch 502 fetches the program from PP memory 204 and transmits the program to decode 504. Decode 504 decodes and/or translates the program into instructions that can be executed by a local processor (not shown). Each instruction is executed for a different thread within a warp. In one embodiment, the same instruction is executed for each different thread within the warp.

Dispatch 506 receives the instructions from decode 504 and collects one or more register values associated with the instructions. The register values could reflect, for example, operands and/or constants required to execute the instructions. When each instruction is executed for a different thread within the warp, dispatch 506 collects one or more different register values for each thread. The register values are included within a set of register files. As described in greater detail below in FIG. 6, each register file is associated with a set of error-correcting code (ECC) bits that can be used to correct and/or detect bit flip errors within a particular register file. Additionally, two or more sets of ECC bits can be grouped together to form an additional register file.

Once dispatch 506 collects the necessary register values, dispatch 506 transmits these values, along with the instructions associated with those values, to execute 508. Execute 508 executes the received instructions using the associated register values and outputs data resulting from this execution to write back 510. Write back 510 writes the data to memory. HW pipeline 500 may then execute a different program to perform additional processing operations.

Figure 6:
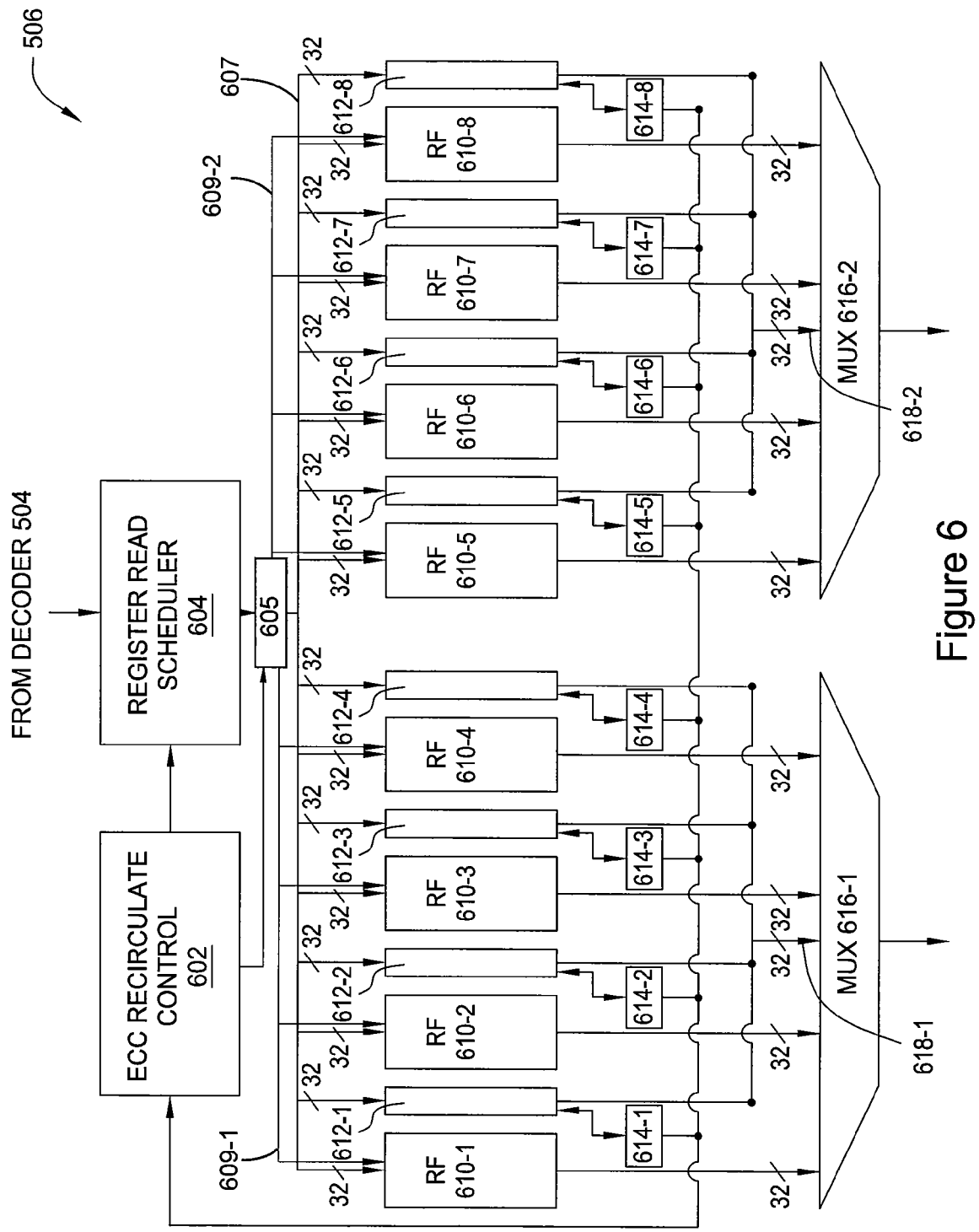
FIG. 6 is a block diagram of the dispatch unit of FIG. 5, according to one embodiment of the invention.

FIG. 6 is a block diagram of dispatch unit 506 of FIG. 5, according to one embodiment of the invention. As shown, dispatch unit 506 includes an error-correcting code (ECC) recirculate control 602, a register read scheduler 604, ECC correct logic 605, address bus 607, data bus 609, register files (RFs) 610-1 through 610-8, ECC bits 612-1 through 612-8, ECC check logic 614-1 through 614-8, and multiplexers 616-1 and 616-2. The portion of dispatch unit 506 shown in FIG. 6 comprises an instruction pipeline that receives instructions and collects values associated with those instructions. Subsequent portions of dispatch unit 506 comprise a math pipeline that performs math-oriented operations. In one embodiment, the math pipeline is included in a subsequent processing unit of HW pipeline 500.

As described above in FIG. 5, dispatch unit 506 receives instructions associated with a warp from decode 504. Specifically, register read scheduler 604 within dispatch unit 506 receives instructions associated with the threads within the warp. Register read scheduler 604 is configured to access register values associated with each thread based on a mapping between threads and register values. The register values for a given thread may be required in order to execute the instructions associated with that thread. The register values are stored within register files 610-1 through 610-8.

Each register file 610 is a single-ported RAM module that stores 32 different 32-bit register values. A given register file 610 includes word enables at 32-bit boundaries, allowing each of the 32 register values to be accessed independently. An address bus 607 is coupled to each word enable, thereby allowing each register value within register files 610 to be accessed separately. Register read scheduler 604 is configured to write data to register files 610 via data bus 609. Register read scheduler 604 is coupled to data bus 609, as well as to address bus 607, via ECC correct logic 605.

In certain embodiments of the invention, ECC correct logic 605 provides error correction functionality, as further described below. However, when error correction is not necessary, ECC correct logic 605 simply allows register read scheduler 604 to transmit data and address signals to register files 610 via address bus 607 and data bus 609, respectively. Those skilled in the art will understand that the size of each register file 610, the location of the word enables for each register file, the width of the address bus 607, and the data bus 609 may vary in different embodiments of the present invention.

When processing a warp, register read scheduler 604 identifies the specific register files 610 that store the required register values and then schedules one or more read operations targeting the identified register files 610. The different register values may be stored in different register files 610. Thus, several read cycles may be necessary in order to read all of the required register values. When register read scheduler 604 reads register values from a given register file 604, one of the multiplexers 616 receives the register values and then transmits those values to execute 508. In one embodiment, an intermediate unit receives register values from multiplexers 616 during the one or more read cycles. The intermediate unit collects all of the register values associated with the threads in the warp before transmitting those values to execute 508.

In one embodiment, each register file 610 is associated with different ECC bits 612. A set of ECC bits 612 associated with a particular register file 610 may be used to identify bit flip errors within that register file 610. Bit flip errors may occur when, for example, a neutron or an alpha particle impacts register file 610, causing one or more bits to change state. ECC bits 612 include 8 ECC bits for each 32-bit register value within register file 610. Accordingly, when register file 610 stores 32 register values, the set of ECC bits 612 associated with register file 610 include 8*32=256 ECC bits. ECC bits 612 include byte enables at 8-bit boundaries. Address bus 607 provides address lines to the byte enables, allowing register read scheduler 604 to access the 8 ECC bits associated with a particular register value separately.

Register read scheduler 604 initially writes the ECC bits 612 when register values are first written to register files 610 via data bus 609. When register read scheduler 604 reads register file 610, and register values stored in register file 610 are output across bus 618, ECC check logic 614 is configured to simultaneously read ECC bits 612 associated with register file 610. Based on the ECC bits 612, ECC check logic 614 determines whether a bit flip error has occurred within register file 610. When a bit flip error occurs, ECC check logic 614 notifies ECC recirculate control 602. In response, ECC recirculate control 602 transmits control signals to ECC correct logic 605. ECC correct logic 605 then reads the register value(s) that include the flipped bit(s) as well as the ECC bits 612 associated with those register values. ECC correct logic 605 corrects the register value(s) and then writes the correct register values back to the register file 610 via the data bus 609. In one embodiment, ECC recirculate control 602, ECC correct logic 605, and/or ECC check logic 614 implements a single error correction/double error detection (SEC/DED) code to identify and correct bit flip errors. Through the foregoing technique, bit flip errors may be minimized.

One advantage of the error-correcting functionality described above and the architecture through which that functionality is realized is that register values can be read from one register file 610 while register values within a different register file 610 are corrected. For example, when ECC check logic 614 identifies an error in register file 610-1, ECC correct logic 605 may proceed to correct the register values stored in register file 610-1. Simultaneously, register read scheduler 604 may cause register file 610-6 to output register values to mux 616-2 via bus 618-2. The parallel architecture of dispatch unit 506 allows for greater throughput than prior art memory systems that employ ECC.

Those skilled in the art will recognize that implementing error-correcting logic to ensure data integrity of register files in a general purpose computer that employs a general-purpose processing unit, as described above, represents a unique approach compared to prior art approaches. Specifically, error-correcting logic that ensures the data integrity of register files has conventionally been implemented within high-availability processing units that are deployed in reliable, available, and scalable (RAS) computer systems, such as flight control computer systems.

Certain customers that purchase parallel processing subsystem 112 may wish to perform processing operations that cannot tolerate bit flip errors, including, for example, finance-oriented processing operations or medical-oriented processing operations. These customers may thus enable ECC recirculate control 602, ECC correct logic 605, and ECC check logic 614 to implement the error-correcting functionality described above. However, other customers that purchase the parallel processing subsystem 112 may not perform operations overly sensitive to bit flip errors and, thus, may not require this error-correcting functionality. For these customers, the ECC bits 612 are useless for their intended task.

In this situation, the ECC bits 612 are used to provide additional register value storage instead of being used for error-correcting functionality. Since each set of ECC bits 612 includes 256 bits, four sets of ECC bits 612 can be grouped together to represent an additional 1024-bit register file 612. For example, ECC bits 612-1 through 612-4 can be grouped together to provide an additional register file 610. When sets of ECC bits 612 are grouped together in this fashion, each set of ECC bits 612 stores 8 register values. Each of these register values can be accessed independently by the register read scheduler 604 via the byte enables associated with the ECC bits 612. Since these byte enables occur at 8-bit boundaries, the register read scheduler 604 accesses four consecutive byte enables simultaneously to access a single register value stored within one set of ECC bits 612, as described in greater detail in FIG. 7.

Figure 7:
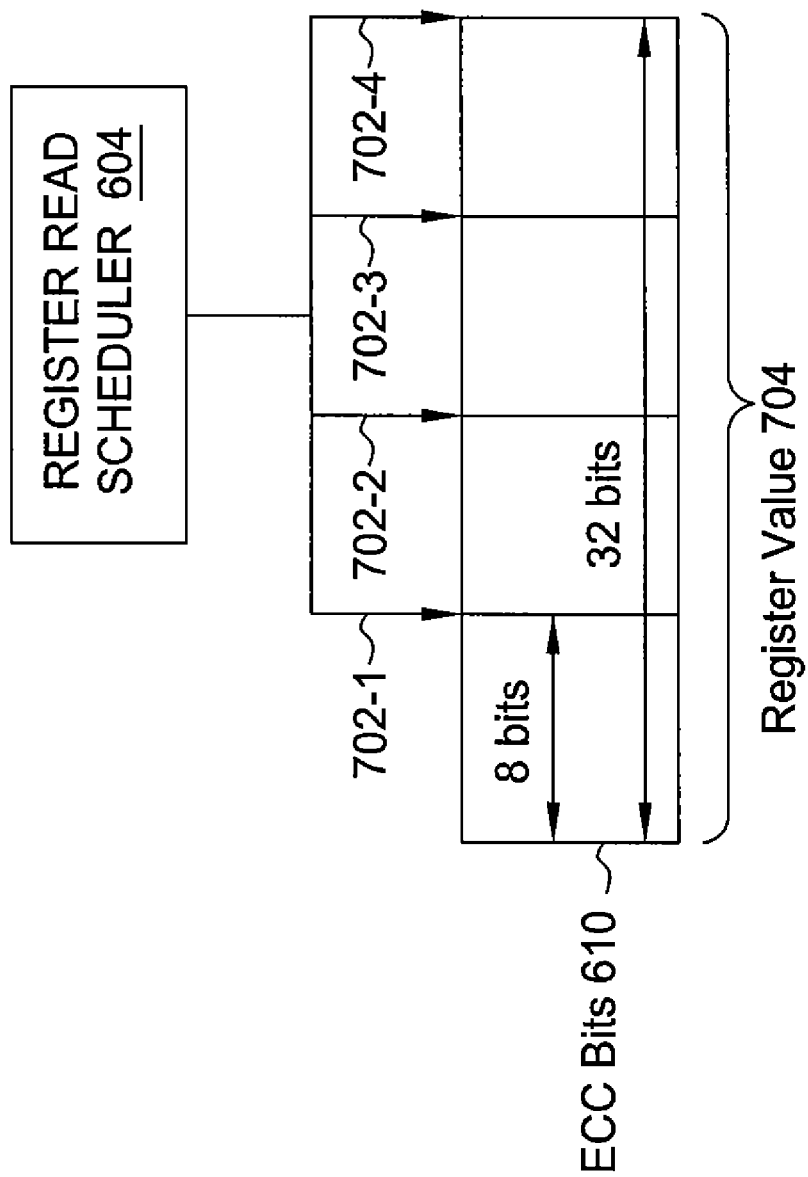
FIG. 7 is a conceptual diagram that illustrates a set of ECC bits configured to store register values, according to one embodiment of the invention.

FIG. 7 is a conceptual diagram that illustrates a set of ECC bits 612 configured to store register values, according to one embodiment of the invention. As shown, ECC bits 612 includes a register value 704 that spans byte enables 702-1 through 702-4. Byte enables 702-1 through 702-4 are tied together, thereby allowing register read scheduler 604 to read and/or write register value 704. When reading and/or writing register value 704, register read scheduler 604 accesses byte enables 702-1 through 702-4 simultaneously. This technique allows register read scheduler 604 to access register values stored in ECC bits 612 in a similar fashion as when accessing register values stored in the register files 610.

To support this functionality, read register scheduler 604 implements a second mapping that associates threads with register values stored in either register files 610 or within a group of ECC bits 612. The second mapping allows groups of ECC bits to appear as a single register file to the register read scheduler 604, thereby allowing transparent access to register values regardless of where the register values are actually stored.

Referring back now to FIG. 6, ECC bits 612-1 through 612-4 are coupled to multiplexer 616-1 and ECC bits 612-5 through 612-8 are coupled to multiplexer 616-2. When register read scheduler 604 reads a register value from a particular set of ECC bits 612, the set of ECC bits 612 outputs the register value to the relevant multiplexer 616 via the relevant bus 618. Accordingly, register values stored in ECC bits 612 can be collected by multiplexers 616 in a similar fashion as register values collected from register files 610.

Importantly, the architecture described above includes connections between ECC bits 612 and ECC check correct bits 614 as well as connections between ECC bits 612 and multiplexers 616. Consequently, ECC bits 612 can be used for error correction or, alternatively, ECC bits 612 can be used for additional register file storage. When ECC bits 612 are used for additional register file storage, ECC correct logic 605 and ECC check logic 614 may be disabled. Further, register read scheduler 604 may write register values to ECC bits 612 via data bus 609 (connection not shown). In one embodiment, the ECC correct logic 605 and the ECC check logic 614 is not included in the parallel processing subsystem 112 when the error-correcting functionality is not required. In another embodiment, ECC bits 612 may be transitioned from being used for error-correction to being used for additional register file storage without physically reconfiguring any hardware components of parallel processing subsystem 112.

By grouping sets of ECC bits 612 together in the fashion described above, the throughput of the parallel processing subsystem 122 can be improved by as much as 3%.

In summation, when error correcting-functionality is enabled, the parallel architecture described herein allows bit flip errors within a first register file to be corrected independently of register values being read from a second register file.

When error-correcting functionality is not enabled, error-correcting code (ECC) bits not being used for ECC purposes can be grouped together to form additional register files. Since ECC bits may include byte enables at different boundaries than byte enables associated with register files, the byte enables of the ECC bits can be tied together into a group to allow access to an equal number of bits compared to the byte enables associated with the register files. In this fashion, register files, as well as ECC bits combined to form additional register files, can both store data having the same size.

Advantageously, the degree to which the error-correcting functionality reduces the throughput of the parallel processing subsystem can be minimized since error-correction and register value access occur simultaneously. Additionally, in situations where error-correction functionality is not required, the ECC bits are used to provide extra register file storage, thereby improving the performance of the parallel processing subsystem.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons skilled in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

What is claimed is:

1. A processing unit, comprising:
first and second memory modules;
error-correcting code (ECC) logic coupled to each of the first and second memory modules and configured to correct bit flip errors within the first and second memory modules; and
a memory controller coupled to each of the first and second memory modules and configured to access data within the first and second memory modules, wherein the memory controller is further configured to access data stored in the first memory module while the ECC logic corrects bit flip errors within the second memory module.

2. The processing unit of claim 1, wherein the first and second memory modules are register files.

3. The processing unit of claim 2, wherein the first and second memory modules are random-access memory (RAM) modules.

4. The processing unit of claim 1, wherein the second memory module is coupled to a set of ECC bits and the ECC logic identifies bit flip errors within the second memory module based on the set of ECC bits.

5. The processing unit of claim 4, wherein the ECC logic implements a single error correction/double error detection (SEC/DED) error-correcting code to identify and correct bit flip errors.

6. The processing unit of claim 4, wherein the ECC logic includes an ECC check unit configured to detect bit flip errors and an ECC correct unit configured to correct bit flip errors.

7. A method for correcting bit flip errors within a set of two or more memory modules, comprising:
  accessing data stored in a first memory module in the set of two or more memory modules; and
  correcting one or more bit flip errors within a second memory module in the set of two or more memory modules independently of the first memory module being accessed.

8. The method of claim 7, wherein the first and second memory modules are register files.

9. The method of claim 8, wherein the first and second memory modules are random-access memory (RAM) modules.

10. The method of claim 7, wherein the step of correcting one or more bit flip errors includes identifying bit flip errors within the second memory module based on a set of ECC bits coupled to the second memory module.

11. The method of claim 10, wherein bit flip errors are identified using a single error correction/double error detection (SEC/DED) error-correcting code.

12. A general-purpose computer system, comprising:
  a processing unit;
  a memory unit having register files;
  a memory controller coupled to the memory unit; and
  ECC logic coupled to the memory unit and configured to correct bit flip errors within the memory unit,
  wherein the memory controller is configured to access data within the memory unit while the ECC logic corrects the bit flip errors within the memory unit.

13. The computer system of claim 12, wherein the memory unit comprises first and second memory modules.

14. The computer system of claim 13, wherein the memory controller is coupled to each of the first and second memory modules and is configured to access data within the first and second memory modules.

15. The computer system of claim 14, wherein the ECC logic coupled to each of the first and second memory modules.

16. The computer system of claim 15, wherein the memory controller is configured to access data stored in the first memory module while the ECC logic corrects bit flip errors within the second memory module.

17. The computer system of claim 16, wherein the first and second memory modules are random-access memory (RAM) modules.

18. The computer system of claim 16, further comprising a set of ECC bits coupled to the second memory module, wherein the ECC logic identifies bit flip errors within the second memory module based on the set of ECC bits.

19. The computer system of claim 12, wherein the ECC logic implements a single error correction/double error detection (SEC/DED) ECC to identify and correct bit flip errors.

* * * * *